United States Patent
Lee

(10) Patent No.: US 11,974,411 B2
(45) Date of Patent: Apr. 30, 2024

(54) THIN HEAT DISSIPATION DEVICE AND METHOD FOR MANUFACTURING THE SAME

(71) Applicant: Ke Chin Lee, Taoyuan (TW)

(72) Inventor: Ke Chin Lee, Taoyuan (TW)

( * ) Notice: Subject to any disclaimer, the term of this patent is extended or adjusted under 35 U.S.C. 154(b) by 425 days.

(21) Appl. No.: 17/418,924

(22) PCT Filed: Jan. 17, 2020

(86) PCT No.: PCT/US2020/013981
§ 371 (c)(1),
(2) Date: Jun. 28, 2021

(87) PCT Pub. No.: WO2020/150544
PCT Pub. Date: Jul. 23, 2020

(65) Prior Publication Data
US 2022/0071054 A1 Mar. 3, 2022

Related U.S. Application Data

(60) Provisional application No. 62/793,944, filed on Jan. 18, 2019.

(51) Int. Cl.
*F28F 7/00* (2006.01)
*H05K 7/20* (2006.01)

(52) U.S. Cl.
CPC ............... *H05K 7/20218* (2013.01)

(58) Field of Classification Search
CPC .................................................. H05K 7/20218
(Continued)

(56) References Cited

U.S. PATENT DOCUMENTS 6,230,407 B1   5/2001 Akutsu
2007/0068657 A1   3/2007 Yamamoto et al.
(Continued)

FOREIGN PATENT DOCUMENTS

CN    203687715 U    7/2014
JP      0763487 A    3/1995
(Continued)

OTHER PUBLICATIONS

International Search Report issued in application No. PCT/US2020/013981.
(Continued)

*Primary Examiner* — Davis D Hwu
(74) *Attorney, Agent, or Firm* — McClure, Qualey & Rodack, LLP

(57) ABSTRACT

The present invention is related to a thin heat dissipation device and a method for manufacturing the same. The device of the present invention mainly comprises a hollow body having an enclosed chamber and a working fluid with which the enclosed chamber is filled. The enclosed chamber comprises a first fluid channel and a second fluid channel. The first and second fluid channels extend in the longitudinal direction of the hollow body, are juxtaposed in the width direction of the hollow body and communicated with each other, and an interface between the first fluid channel and the second fluid channel has a height of about 0.1 mm or less. As such, a novel capillary structure which is capable of greatly reducing the entire thickness, enhancing heat transfer efficiency and reducing cost and which is reliable and durable is provided.

3 Claims, 6 Drawing Sheets

(58) Field of Classification Search
USPC .......................................................... 165/80.2
See application file for complete search history.

(56) References Cited

U.S. PATENT DOCUMENTS

| | | |
|---|---|---|
| 2010/0266864 A1 | 10/2010 | Lee |
| 2011/0024085 A1 | 2/2011 | Huang et al. |
| 2014/0360701 A1 | 12/2014 | Aoki et al. |
| 2015/0192369 A1 | 7/2015 | Rivera et al. |
| 2020/0025458 A1 | 1/2020 | Takahashi et al. |

FOREIGN PATENT DOCUMENTS

| | | |
|---|---|---|
| JP | H08327261 A | 12/1996 |
| JP | H11190596 A | 7/1999 |
| JP | 2002022377 A | 1/2002 |
| JP | 2002151637 A | 5/2002 |
| WO | 99/42781 A1 | 8/1999 |
| WO | 2018/155641 A1 | 8/2018 |
| WO | WO0154806 A1 * | 8/2021 |

OTHER PUBLICATIONS

KR Office Action dated Dec. 23, 2023 in application No. 10-2021-7022085.
TW Office Action dated Jan. 29, 2021 in Taiwan application No. 109101410.
Search Report issued in TW Office Action dated Jan. 29, 2021 in Taiwan application No. 109101410.

* cited by examiner

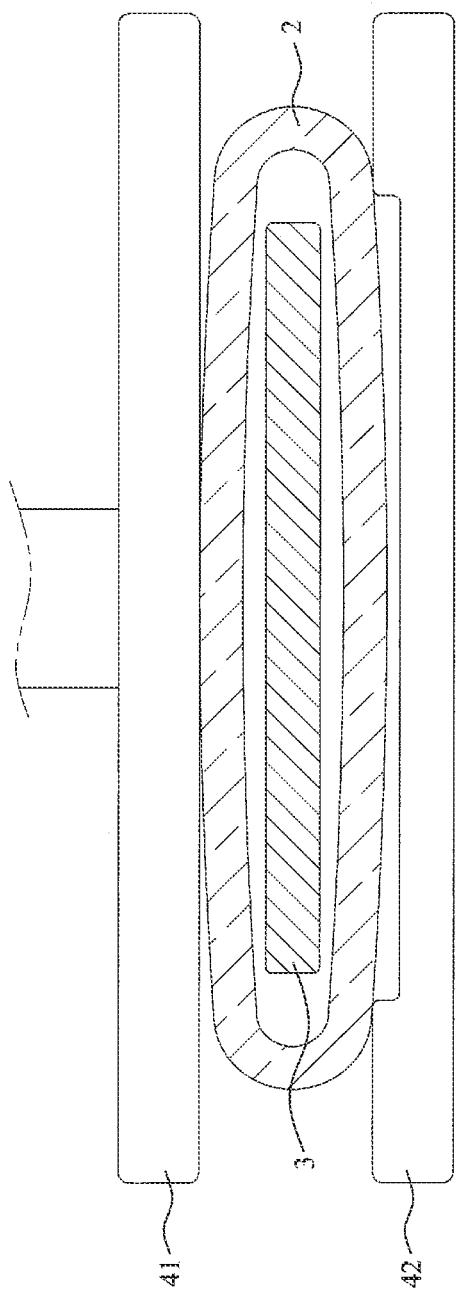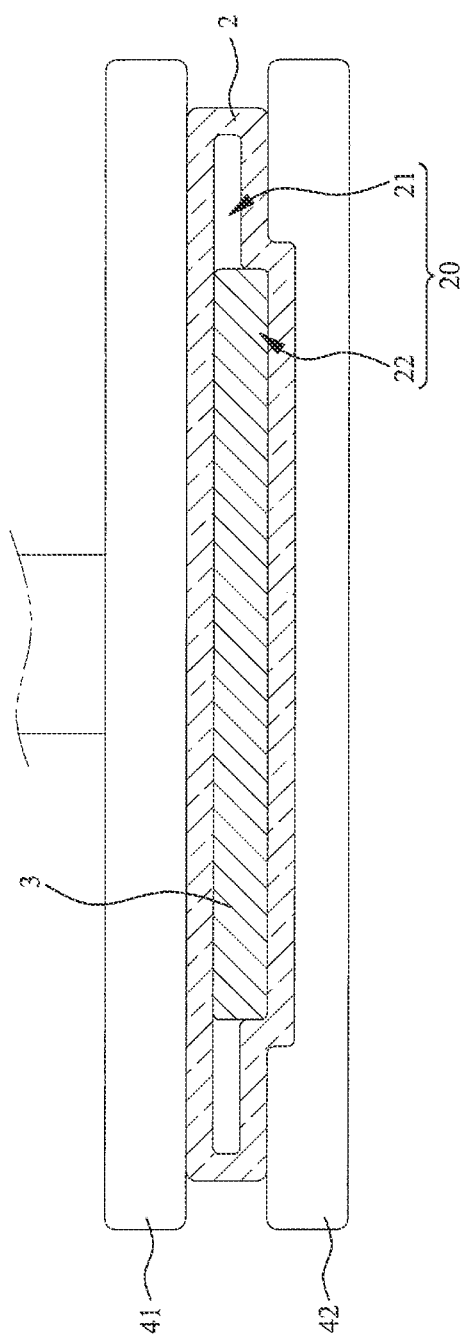

THIN HEAT DISSIPATION DEVICE AND METHOD FOR MANUFACTURING THE SAME

CROSS REFERENCE TO RELATED PATENT APPLICATION(S)

This application is a 371 National Stage Application of PCT application no. PCT/US2020/013981, filed on Jan. 17, 2020, which claims priority to U.S. Provisional Application No. 62/793,944, filed on Jan. 18, 2019, the subject matters of which are incorporated herein by reference.

BACKGROUND OF THE INVENTION

Field of the Invention

The invention relates to a thin heat dissipation device and a method for manufacturing the same, and more particularly to a thin heat dissipation device suitable for a portable electronic device and a method for manufacturing the same.

Description of the Related Art

As the computing power of portable electronic devices continues to increase, the need for heat dissipation is also becoming increasingly important. Since the portable electronic devices are becoming lighter and more compact, the space for arranging heat dissipation devices is limited.

Heat dissipation components for portable electronic devices have been developed, such as U.S. Pat. No. 9,565,786 "Sheet-Like Heat Pipe and Electronic Device Provided with Same". However, as described in U.S. Pat. No. 9,565,786, the traditional heat pipe still has to be provided with a capillary structure for returning the condensed working fluid. The common capillary structures include meshes, fibers, sintered powders or micro-grooves.

Furthermore, the capillary structure in the heat pipe not only increases manufacturing cost but also complicates the manufacturing process. For example, in order to attach the capillary structure such as meshes, fibers or sintered powders, it has to be heated for adhesion or sintered, and an annealing process may have to be carried out for changing material properties so that reliability is affected. In the case that the micro-grooves are used, an etching process has to be performed.

The capillary structure in the heat pipe also has a considerable volume to allow sufficient work fluid to be circulated. As a result, the thickness of the heat pipe is limited and cannot be reduced, and thus the thickness of the electronic device is indirectly affected.

On the other hand, because the openings of the grooves of the traditional heat pipe are perpendicular to the outer wall, the width or depth of the grooves must be limited by the thickness of the pipe wall. The grooves cannot be too deep, resulting in that amount of the condensed working fluid in the grooves is limited. However, the heat transfer efficiency of the heat pipe depends on the amount of the condensed in the grooves so that the heat transfer efficiency is limited and cannot be greatly improved. The traditional heat pipe having grooves cannot be further thinned due to its own structure.

The heat pipe cannot be widely applied to the existing portable electronic devices for the reasons as mentioned above, and it is also an urgent problem to be solved by the industry at present.

SUMMARY OF THE INVENTION

The main object of the present invention is to provide a thin heat dissipation device, and to provide a novel capillary structure, which is capable of greatly reducing the overall thickness, enhancing the heat transfer efficiency and reducing cost effectively and which is reliable and durable.

Another object of the prevent invention is to provide a method for manufacturing a thin heat dissipation device which is simple and has a high yield rate and which has low manufacturing cost and is suitable for mass production.

In order to achieve the above objects, a thin heat dissipation device of the present invention mainly includes a hollow body, provided therein with an enclosed chamber; and a working fluid, with which the enclosed chamber of the hollow body is filled. The enclosed chamber includes at least one first fluid channel and at least one second fluid channel; the first fluid channel and the second fluid channel extend in the longitudinal direction of the hollow body and are communicated with each other; an interface between the first fluid channel and the second fluid channel has a height of about 0.1 mm or less; and the first fluid channel and the second fluid channel are juxtaposed in the width direction of the hollow body.

As mentioned above, the thin heat dissipation device of the present invention is provided with the first fluid channel having an opening of about 0.1 mm or less high constituting a novel capillary structure and allowing the condensed working fluid to circulate without use of the capillary structure of the conventional heat pipe in the form of meshes, fibers or sintered powders. On the other hand, the first fluid channel and the second fluid channel are juxtaposed in the width direction of the hollow body, thereby reducing the thickness of the device and making the device thinner. As such, the structure of the thin heat dissipation device of the present invention is simple, reliable and low-cost and has excellent heat dissipation efficiency.

Preferably, the second fluid channel has a height greater than 0.1 mm, and the first fluid channel has a width which is at least two times, preferably, at least three times, and more preferably, at least five times the height of the first fluid channel so that the first fluid channel is capable of providing sufficient space for returning a sufficient amount of the condensed fluid by capillary action. In other words, because the width of the first fluid channel of the present invention is parallel to the width direction of the device, the width of the first fluid channel can be arbitrarily adjusted or extended without increasing the thickness of the device. That is, amount of the working fluid can be increased or decreased according to actual requirements so as to enhance the heat transfer efficiency.

In another aspect of the present invention, the cross section of the enclosed chamber of the thin heat dissipation device of the present invention is T-shaped, and each of two opposite sides of the second fluid channel is provided with the first fluid channel, thereby increasing the space for returning the condensed working fluid and increasing the amount of the condensed working fluid in the first fluid channel in order to further enhance the heat dissipation efficiency.

In order to achieve the above objects, a thin heat dissipation device of the present invention mainly includes a hollow body, provided therein with an enclosed chamber; and a working fluid, with which the enclosed chamber of the hollow body is filled. The enclosed chamber includes a plurality of heat conduction channels, and each heat conduction channel includes at least one first fluid channel and at least one second fluid channel. The first fluid channel and the second fluid channel extend in the longitudinal direction of the hollow body and are communicated with each other, and an interface between the first fluid channel and the second fluid channel has a height of about 0.1 mm or less. Also, the first fluid channel and the second fluid channel are juxtaposed in the width direction of the hollow body.

As such, the thin heat dissipation device of the present invention may be a heat sink provided with a plurality of heat conduction channels capable of providing a large area for heat transfer and heat dissipation, while maintaining a quite thin thickness. The enclosed chamber further comprises a first confluence portion and a second confluence portion, and two ends of each of the plurality of heat conduction channels are communicated with the first confluence portion and the second confluence portion, respectively, so vapor working fluid or liquid working fluid is converged at the first confluence portion or the second confluence portion, and the heat spreading effect of the heat dissipation device can be achieved.

In order to achieve the above objects, a method for manufacturing a thin heat dissipation device of the present invention comprises: a step (A) of providing a hollow body, an upper mold and a lower mold, the hollow body having an opening at one end; a step (B) of placing the hollow body between the upper mold and the lower mold; a step (C) of compressing the hollow body with the upper mold and lower mold; a step (D) of releasing the upper mold and the lower mold; and a step (E) of filling the hollow body with a working fluid, degassing the hollow body and then sealing the opening so as to form an enclosed chamber, wherein at least one first fluid channel and at least one second fluid channel are formed in the enclosed chamber; the first fluid channel and the second fluid channel extend in the longitudinal direction of the hollow body and are communicated with each other; and an interface between the first fluid channel and the second fluid channel has a height of about 0.1 mm or less.

As such, the above-mentioned method provided by the present invention is quite simple. According to the method of the present invention, the thin heat dissipation device can be manufactured mechanically by stamping without use of etching or sintering, and the method of the present invention does not have additional steps for forming a conventional capillary structure. According to the method of the present invention, the first and the second fluid channels can be formed in a single step. Therefore, the method of the present invention is a very innovative and ingenious.

In the step (A) of the above-mentioned method, a mold inset is further provided; in the step (B), the mold insert is inserted into the hollow body from the opening; and in the step (D), the mold insert is removed. The second fluid channel is a region formed by the mold insert. In other words, in the above method provided by the present invention, the second fluid channel can be formed by the mold insert, but the present invention is not limited to this. The method of the present invention can also be implemented to achieve the objects of the invention without use of the mold insert.

In order to achieve the above objects, another method for manufacturing a thin heat dissipation device of the present invention comprises: a step (A) of providing a hollow body, an upper mold and a lower mold, the hollow body being provided therein with an enclosed chamber filled with a working fluid; a step (B) of placing the hollow body between the upper mold and the lower mold; a step (C) of compressing the hollow body between the upper mold and lower mold; and a step (D) of releasing the upper mold and the lower mold, wherein at least one first fluid channel and at least one second fluid channel are formed in the enclosed chamber; the first fluid channel and the second fluid channel extend in the longitudinal direction of the hollow body and are communicated with each other; and an interface between the first fluid channel and the second fluid channel has a height of about 0.1 mm or less.

In other words, the above-mentioned method provided by the present invention is simpler. The thin heat dissipation device can be formed by placing a heat dissipation device (such as a heat pipe) that has been filled with a working fluid, degassed and sealed into a mold and then stamping the heat dissipation device. This method provided by the present invention is implemented by use of the working fluid with use of the mold insert proposed in the above-mentioned method. The working fluid has a great supporting ability, especially after being heated and then evaporated and expanded.

Furthermore, in the above-mentioned method provided by the present invention, at least one of the upper mold and the lower mold has at least one protrusion and at least one recess portion, the at least one protrusion is provided for forming the first fluid channel, and the at least one recess portion is provided for forming the second fluid channel. In the step (A), the upper mold and the lower mold are preheated to a certain temperature, and then the heat dissipation device is heated by heat conduction to evaporate the working fluid so that vapor working fluid having the supporting ability is generated.

In order to achieve the above objects, another method for manufacturing a thin heat dissipation device of the present invention comprises: a step (A) of providing a first substrate and a second substrate, a surface of at least one of the first substrate and the second substrate being provided with a plurality of elongated protrusions; a step (B) of joining the first substrate and the second substrate so that a chamber is formed between a surface of the first substrate and a surface of the second substrate facing to each other; and a step (C) of filling the chamber with a working fluid, degassing the chamber and then sealing the chamber so as to form an enclosed chamber, wherein the surface of the first substrate and the surface of the second substrate facing to each other and the plurality of elongated protrusions define a plurality of heat conduction channels; each heat conduction channel includes at least one first fluid channel and at least one second fluid channel; the first fluid channel and the second fluid channel are communicated with each other; and an interface between the first fluid channel and the second fluid channel has a height of about 0.1 mm or less.

As such, the above-mentioned method provided by the present invention is more suitable for manufacturing a plate-shaped thin heat dissipation device. In the above method, the two substrates are joined so as to form the chamber, the plurality of elongated protrusions are used to partition the chamber into the plurality of heat conduction channels, and the first fluid channel and the second fluid channel are simultaneously formed in each heat conduction channel. It should be understood that the aforementioned height of 0.1 mm is simply an approximate value, and a height which is slightly higher than 0.1 mm or slightly lower than 0.1 mm should fall within a reasonable equivalent scope.

Preferably, in the above-mentioned method of the present invention, the plurality of elongated protrusions can be formed by stamping, chemical etching, electric discharge machining, or other equivalent forming methods, such as 3D printing, PVD, CVD or even other machining processes, for example, milling. Each elongated protrusion may comprise a convex portion and a rib formed on the top of the convex portion; the rib is to be joined to the second substrate; and the first fluid channel is formed between the second substrate and the convex portion. A plurality of spacer protrusions are provided on the surface of the second substrate, and the plurality of spacer protrusions are provided to be joined to the plurality of elongated protrusions and to partition the chamber into the plurality of heat conduction channels.

BRIEF DESCRIPTION OF THE DRAWINGS

FIGS. 3A to 3B are schematic views showing a process of a first embodiment of a manufacturing method of the present invention.

DESCRIPTION OF THE PREFERRED EMBODIMENTS

Figure 1:
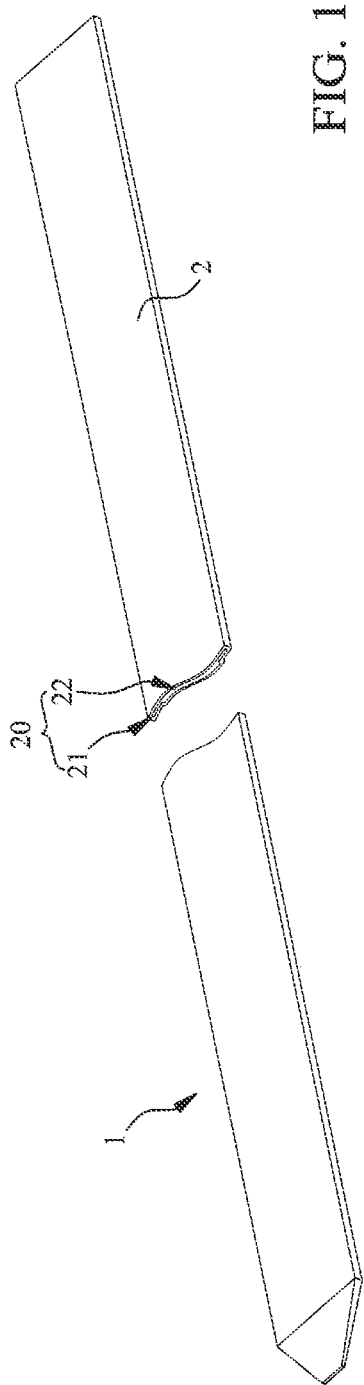
FIG. 1 is a perspective view of a preferred embodiment of a thin heat dissipation device of the present invention.

In describing preferred embodiments of a thin heat dissipation device and a method for manufacturing the same according to the present invention in detail, it is noted that similar elements are designated by the same reference numerals. The drawings of the present invention are merely illustrative and are not necessarily drawn to scale, and all details are not necessarily shown in the drawings.

Figure 2:
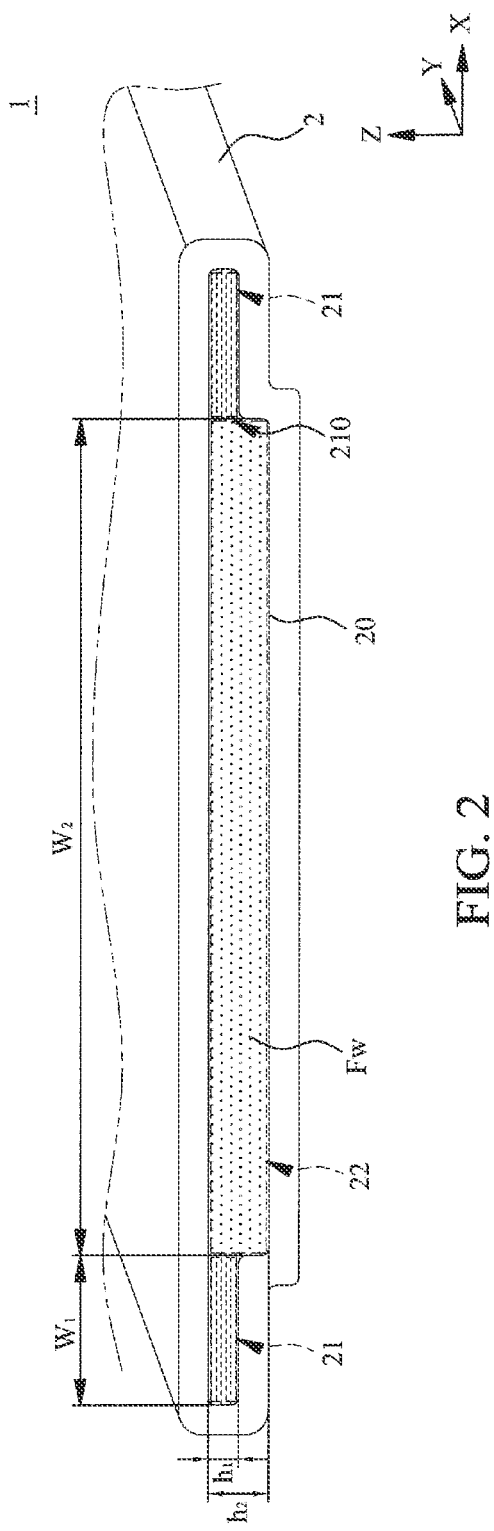
FIG. 2 is a cross-sectional view of a preferred embodiment of the thin heat dissipation device of the present invention.

In describing a preferred embodiment of the thin heat dissipation device of the present invention, reference is made to FIGS. 1 and 2, wherein FIG. 1 is a perspective view of the preferred embodiment of the thin heat dissipation device of the present invention, and FIG. 2 is a cross-sectional view of the preferred embodiment of the thin heat dissipation of the present invention. As shown in the figures, the thin heat dissipation device 1 of this embodiment mainly includes a hollow body 2 and a working fluid Fw. The hollow body 2 is provided therein with an enclosed chamber 20, and the enclosed chamber 20 is filled with a working fluid Fw.

The cross section of the enclosed chamber 20 is T-shaped. The enclosed chamber 20 includes two first fluid channels 21 and a second fluid channel 22. The first fluid channels 21 and the second fluid channel extend in the longitudinal direction (y-axis direction as shown in the figure) of the hollow body 2 and are communicated with each other, and the first fluid channels 21 and the second fluid channel 22 are juxtaposed in the width direction (x-axis direction as shown in the figure) of the hollow body 2. The two first fluid channels 21 are disposed on the two opposite sides of the second fluid channel 22.

In this embodiment, the heat dissipation device has an overall height (thickness) of 0.4 mm, each wall has a thickness of 0.1 mm, the first fluid channel 21 has a height $h_1$ of 0.1 mm, an interface 210 between the first fluid channel 21 and the second fluid channel 22 also has a height of 0.1 mm, and the second fluid channel 22 has a height $h_2$ (in z-axis direction shown in the figure) of 0.2 mm. According to actual verification results, if the height of the lateral opening (the interface 210) of the channel is less than 0.1 mm, a capillary action can be generated. That is, the first fluid channel 21 serves as a capillary structure used for returning condensed working fluid, and the conventional capillary structure such as meshes, fibers, or sintered powders can be omitted. Of course, as the height $h_1$ of the first fluid channel 21 decreases, the capillary phenomenon becomes more pronounced. In other embodiments of the present invention wherein the first fluid channel 21 has the height $h_1$ of 0.05 mm, it has excellent vapor-liquid circulation.

In order to achieve excellent vapor-liquid circulation, the widths (x-axis direction) of the first fluid channel 21 and the second fluid channel 22 can be arbitrarily adjusted. In this embodiment, the width $W_2$ of the second fluid channel 22 is set to 3 mm, the width $W_1$ of each first fluid channel 21 is set to 0.5 mm, and the overall length of each first fluid channel 21 is set to 100 mm. According to this design, this embodiment has excellent heat transfer effect and heat dissipation effect for 3 W to 4 W heat generating elements. Of course, according to different requirements, the above-mentioned specifications can be changed, or a plurality of thin heat dissipation devices 1 can be arranged side by side.

In the following description, methods for manufacturing the thin heat dissipation device 1 of the present invention will be described. Six different manufacturing methods will be described. Reference is made to FIG. 3A to FIG. 3B. FIG. 3A to FIG. 3B are schematic views showing a process of the first embodiment of a manufacturing method of the present invention. First, a hollow body 2 having an opening at one end, a mold insert 3, an upper mold 41 and a lower mold 42 are prepared. The hollow body 2 at this stage is a blind tube with an opened end and a closed end. The hollow body 2 is placed between the upper mold 41 and the lower mold 42, and the mold insert 3 is inserted into the hollow body 2 through the opening, as shown in FIG. 3A.

As shown in FIG. 3B, the hollow body 2 is compressed with the upper mold 41 and the lower mold 42, that is, the hollow body 2 is stamped by use of the upper mold 41 and the lower mold 42 so as to form first fluid channels 21 and a second fluid channel 22, wherein the second fluid channel 22 is a region formed by the mold insert 3. Then, the upper mold 41 and the lower mold 42 are separated (released), and the mold insert 3 is removed. Finally, the hollow body 2 is filled with a working fluid Fw, and the hollow body 2 is degassed, for example, by means of heating or vacuum suction or the combination thereof. Then, the opening is sealed by riveting or welding to form an enclosed chamber 20.

It should be understood that the mold insert 3 in this embodiment may be not a necessary member, and the mold insert can be omitted. It is also feasible that the first fluid channel 21 and the second fluid channel 22 are formed by use of the upper mold 41 and the lower mold 42.

Figure 4A:
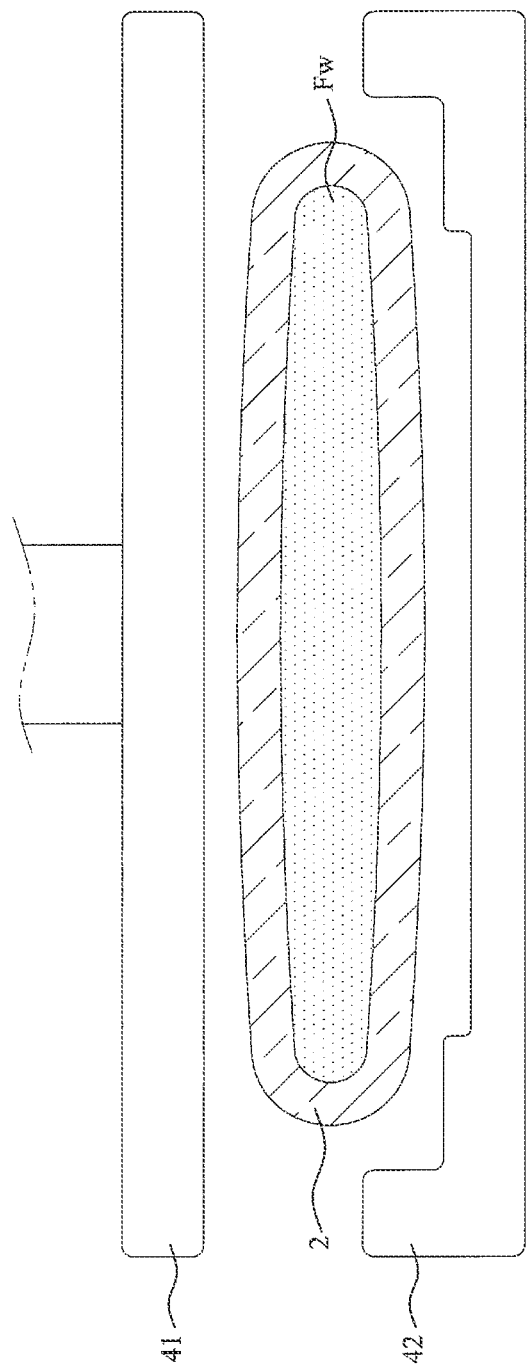
FIGS. 4A to 4B are schematic views showing a process of a second embodiment of the manufacturing method of the present invention.
Figure 4B:
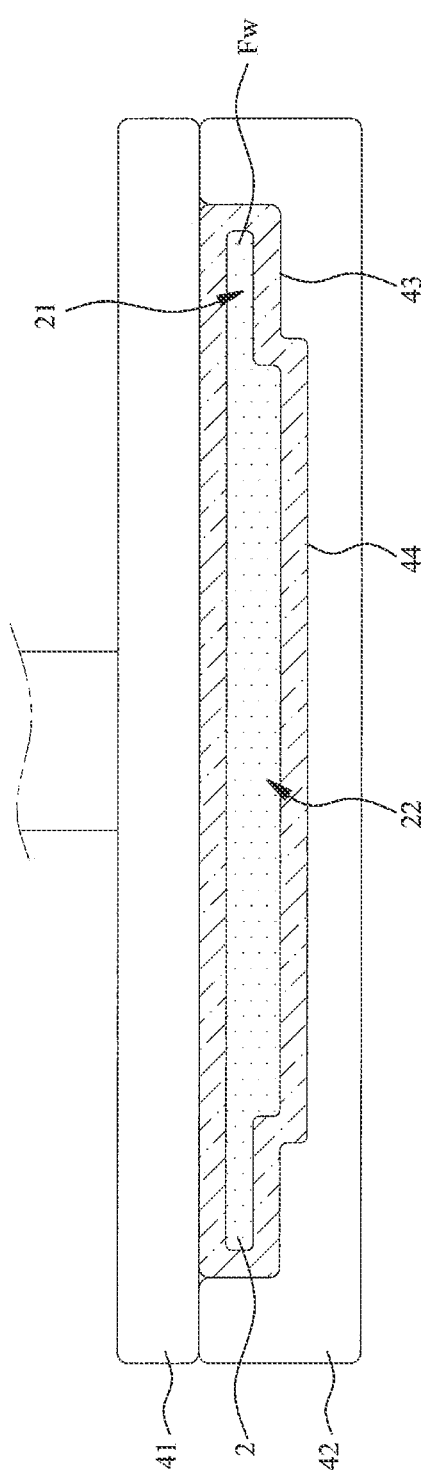

Reference is made to FIGS. 4A and 4B. FIGS. 4A to 4B are schematic views showing a process of the second embodiment of the manufacturing method of the present invention. In this embodiment, a hollow body 2 that has been evacuated, filled with a working fluid Fw and sealed is to be stamped, and the mold insert is omitted. The upper mold 41 and the lower mold 42 are preheated to a certain temperature so that when the upper mold 41 and the lower mold 42 are in contact with the hollow body 2, the working fluid Fw is heated and evaporated by the upper mold 41 and the lower mold 42 through the hollow body 2.

As shown in FIG. 4B, when the hollow body 2 is compressed with the upper mold 41 and the lower mold 42, the vapor of the working fluid Fw serves as a good support which supports the hollow body 2 from the interior so that the hollow body 2 can be shaped with the molds. In this embodiment, the lower mold 42 has two protrusions 43 and one recess portion 44, and the two protrusions 43 are disposed on two opposite sides of the recess portion 44, respectively. The protrusions 43 are used to form first fluid channels 21, and the recess portion 44 is used to form a second fluid channel 22.

In fact, the present invention can be applied not only to the elongated thin heat dissipation device as mentioned in the above embodiments, but also to a plate-shaped heat dissipation device. The following three embodiments can be used to manufacture a plate-shaped heat dissipation device.

Figure 5:
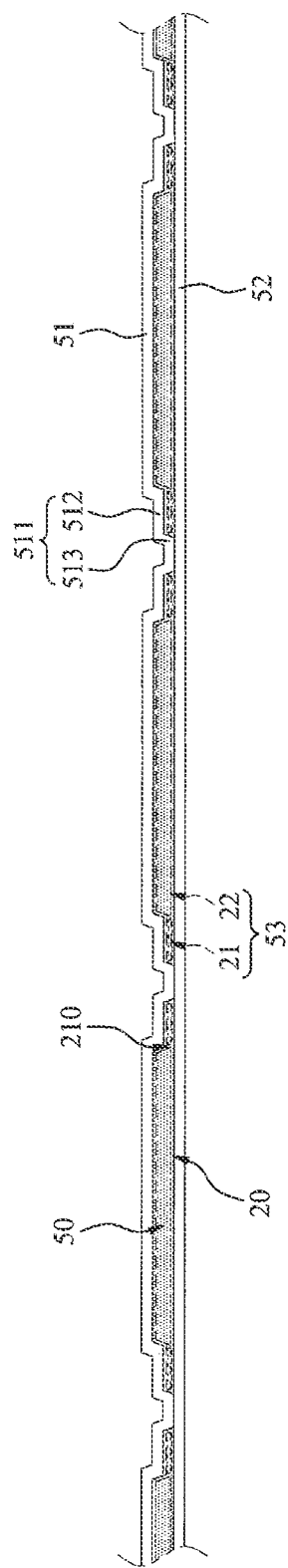
FIG. 5 is a schematic cross-sectional view of the thin heat dissipation device manufactured according to a third embodiment of the manufacturing method of the present invention.

Reference is made to FIG. 5. FIG. 5 is a schematic cross-sectional view of the thin heat dissipation device manufactured according to the third embodiment of the manufacturing method of the present invention. First, a first substrate 51 and a second substrate 52 are provided. A plurality of elongated protrusions 511 are preformed on the first substrate 51 by stamping. Each elongated protrusion 511 includes a convex portion 512 and a rib 513 formed on the top of the convex portion 512 to form a step shape.

Then, the first substrate 51 and the second substrate 52 are joined together. The ribs 513 are provided to be joined to the second substrate 52. After the ribs 513 are joined to the second substrate 52, a chamber 50 is formed between the surface of the first substrate 51 and the surface of the second substrate 52 facing to each other. Next, the chamber 50 is filled with a working fluid, degassed and then is sealed to form an enclosed cavity 20. The manufacturing process is completed.

As shown in FIG. 5, the ribs 513 joined to the second substrate 52 also functions to define a plurality of heat conduction channels 53 spaced apart. More importantly, the lateral surface of the rib 513, the outer surface of the convex portion 512 and a part of the surface of the second substrate 52 together define a first fluid channel 21.

This embodiment is advantageous as the plate-shaped heat dissipation device of the present invention can be produced by stamping a substrate to form a plurality of elongated protrusions 511, joining the stamped substrate to a planar substrate to form a chamber, filling the chamber with a working fluid, degassing the chamber and sealing the chamber.

Figure 6:
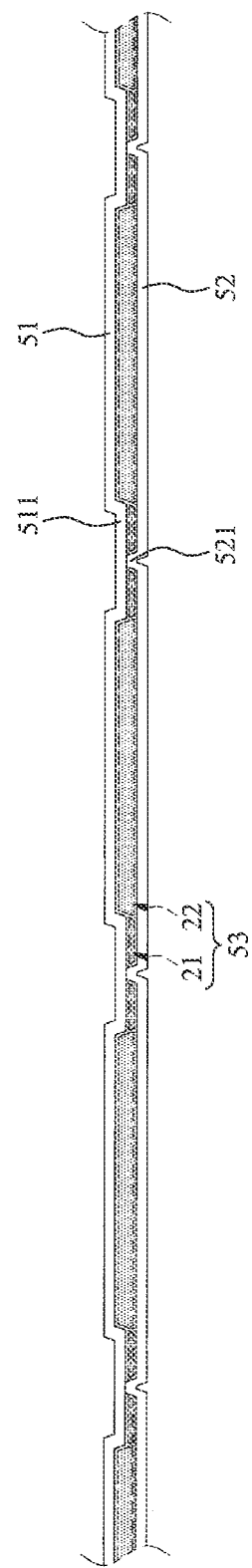
FIG. 6 is a schematic cross-sectional view of the thin heat dissipation device manufactured according to a fourth embodiment of the manufacturing method of the present invention.

Reference is made to FIG. 6. FIG. 6 is a schematic cross-sectional view of the thin heat dissipation device manufactured according to the fourth embodiment of the manufacturing method of the present invention. The difference between the fourth embodiment and the third embodiment lies in that in the fourth embodiment, a plurality of elongated protrusions 511 are formed on the surface of a first substrate 51 by stamping, and a plurality of spacer protrusions 521 are formed on the surface of a second substrate 52 by stamping. When the first substrate 51 and the second substrate 52 are joined to each other, the plurality of spacer protrusions 521 are joined to the plurality of elongated protrusions 511, respectively. In other words, the elongated protrusions 511 of the fourth embodiment is equivalent to the convex portions 512 of the third embodiment, and the spacer protrusions 521 of the fourth embodiment is equivalent to the ribs 513 of the third embodiment. That is, in the fourth embodiment, the elongated protrusions 511 of the third embodiment is formed by two separate parts.

Figure 7:
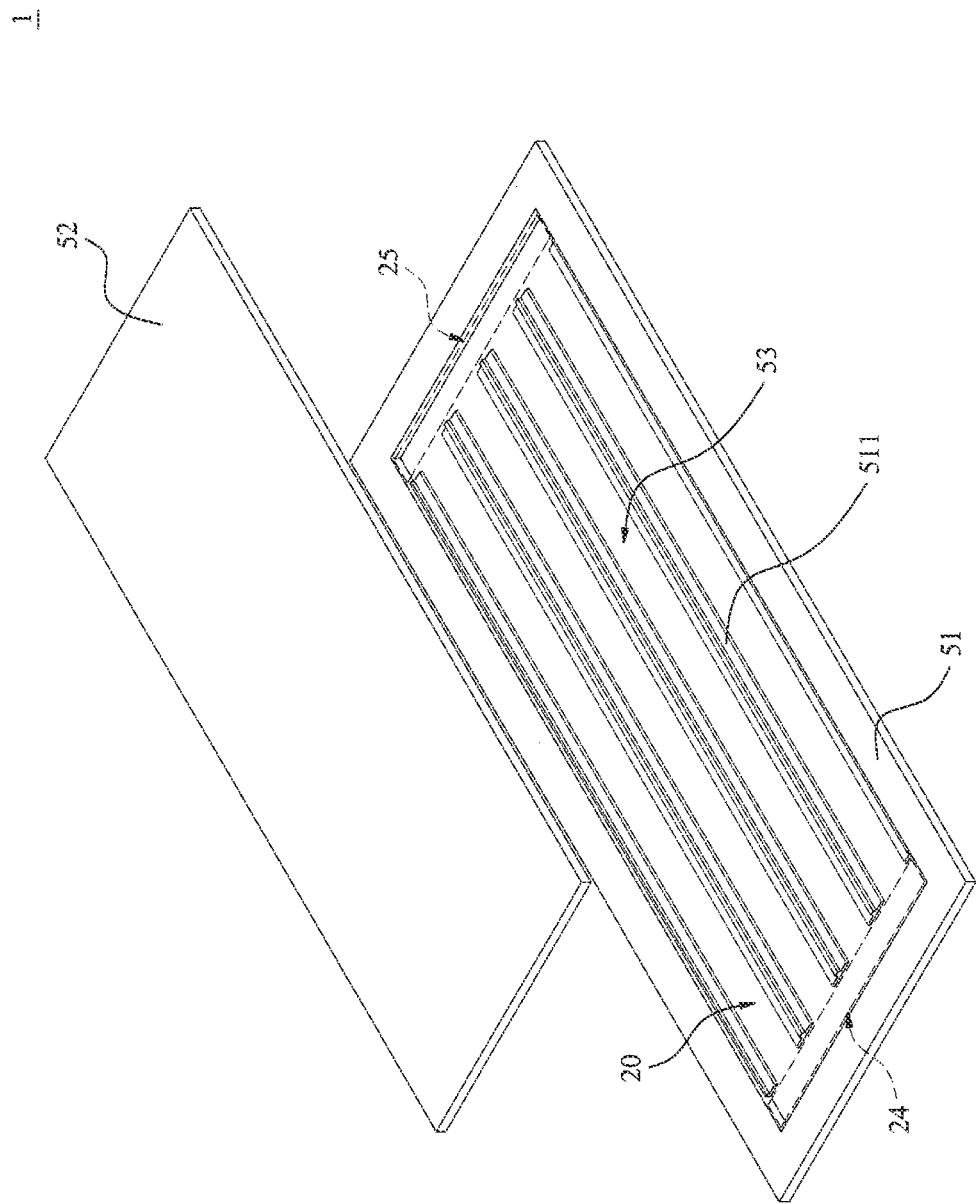
FIG. 7 is an exploded perspective view of the thin heat dissipation device manufactured according to a fifth embodiment of the manufacturing method of the present invention.

Reference is made to FIG. 7. FIG. 7 is a partial cross-sectional perspective view of the thin heat dissipation device manufactured according to the fifth embodiment of the manufacturing method of the present invention. Most of the structural features of the fifth embodiment are the same as those of the third embodiment, except that in the fifth embodiment, etching is used. A plurality of elongated protrusions 511 are formed on a first substrate 51 by etching. In the manufacturing method of the present invention, not only stamping or etching process mentioned in the above embodiments can be used, but also other machining processes (such as milling using machine tools and electric discharge machining) or other deposition processes (such as 3D printing, PVD or CVD).

As shown in FIG. 7, in the thin-plate type heat dissipation device 1 of the fifth embodiment, an enclosed chamber 20 includes four heat conduction channels 53, and each heat conduction channel 53 has a cross section having a shape similar to that as shown in FIG. 2. The enclosed chamber 20 further includes a first confluence portion 24 and a second confluence portion 25 at two ends. Two ends of each of the four heat conduction channels 53 are communicated with the first confluence portion 24 and the second confluence portion 25, respectively. Thereby, vapor or liquid working fluids flowing in the four heat conduction channels 53 can converge at the first confluence portions 24 or second confluence portion 25, and the effect of spreading heat by the thin heat dissipation device 1 can be achieved.

Figure 8A:
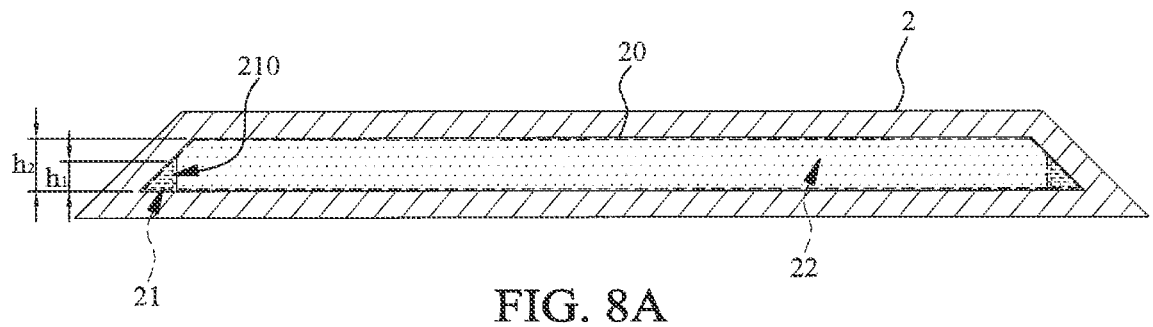
FIG. 8A is a cross-sectional view of another preferred embodiment of the thin heat dissipation device of the present invention.
Figure 8B:
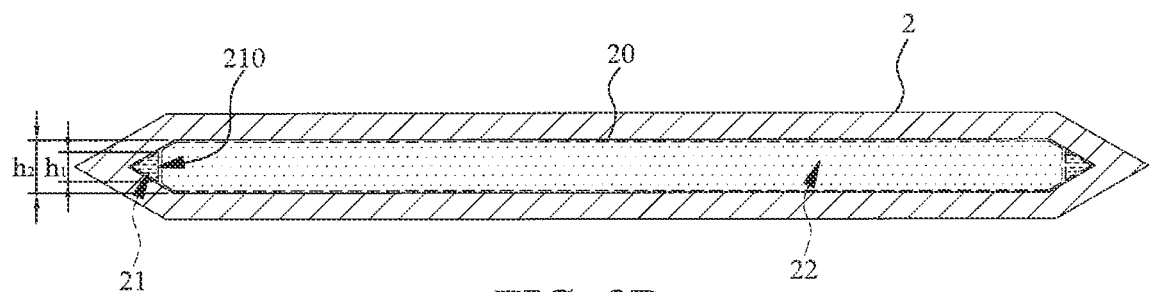
FIG. 8B is a cross-sectional view of a further preferred embodiment of the thin heat dissipation device of the present invention.
Figure 8C:
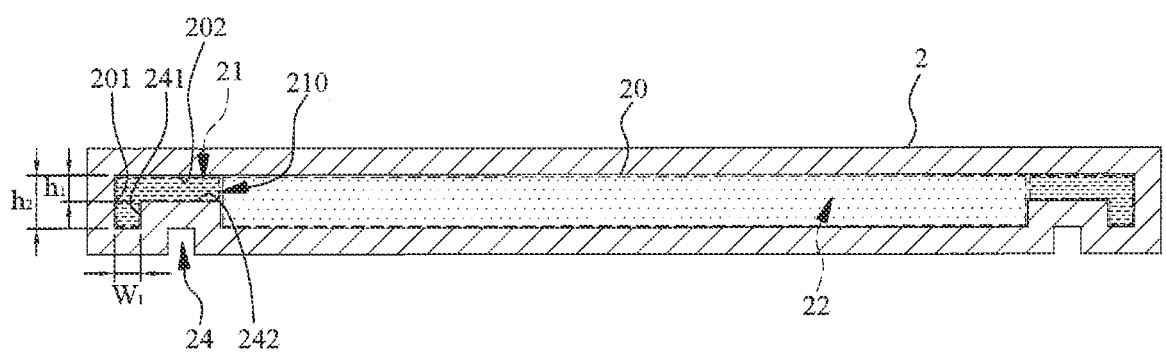
FIG. 8C is a cross-sectional view of another preferred embodiment of the thin heat dissipation device of the present invention.

Reference is made to FIG. 8A, FIG. 8B and FIG. 8C. FIG. 8A is a cross-sectional view of another preferred embodiment of the thin heat dissipation device of the present invention, FIG. 8B is a cross-sectional view of a further preferred embodiment of the thin heat dissipation device of the present invention, and FIG. 8C is a cross-sectional view of another preferred embodiment of the thin heat dissipation device of the present invention. As shown in the figures, FIGS. 8A, 8B, and 8C provide three embodiments of the thin heat dissipation device of the present invention. The embodiment shown in FIG. 8A has a trapezoidal cross section, the embodiment shown in FIG. 8B has a cross section having tapered tips at the left and right lateral sides, and the first fluid channels 21 of the two embodiments are located at the two lateral tips.

In the embodiment shown in FIG. 8C, a hollow body 2 has two inner recessed portions 24 in the vicinity of two lateral sides of the hollow body. Each inner recessed portion 24 is recessed toward the inside of the hollow body and used to form a first fluid channel 21. More specifically, the side edge 241 of the inner recessed portion 24 is spaced from the inner side edge 201 of the hollow body 2 by a width $W_1$ of about 0.1 mm, and the upper edge 242 of the inner recessed portion 24 is spaced from the inner upper edge 202 of the hollow body 2 by a height $h_1$ of about 0.1 mm. Therefore, the first fluid channel 21 is L-shaped. Although the width $W_1$ is set to 0.1 mm in the above embodiment, the present invention is not limited to this. The width $W_1$ can be modified according to actual requirements. For example, the width $W_1$ may be greater than or less than 0.1 mm. The embodiments shown in FIGS. 8A, 8B and 8C are advantageous as they can be shaped and manufactured easily by stamping.

It should be understood that the embodiments have been described for illustrative purposes and are not limiting. Accordingly, it is intended that the invention not be limited to the disclosed embodiments, but that it have the full scope permitted by the language of the following claims.

What is claimed is:

1. A thin heat dissipation device, comprising:
    a hollow body, provided therein with an enclosed chamber; and
    a working fluid, with which the enclosed chamber of the hollow body is filled;
    wherein the enclosed chamber includes at least one first fluid channel and at least one second fluid channel,
    the first fluid channel and the second fluid channel extend in a longitudinal direction of the hollow body and are communicated with each other,
    an interface between the first fluid channel and the second fluid channel has a height of about 0.1 mm or less, and
    the first fluid channel and the second fluid channel are juxtaposed in a width direction of the hollow body;
    wherein the first fluid channel and the second fluid channel are formed by stamping the hollow body with a mold; the mold has at least one protrusion and at least one recess portion, the at least one protrusion is provided for forming the first fluid channel, and the at least one recess portion is provided for forming the second fluid channel.

2. The thin heat dissipation device of claim 1 wherein the second fluid channel has a height greater than 0.1 mm, and the first fluid channel has a width which is at least two times a height of the first fluid channel.

3. The thin heat dissipation device of claim 1 wherein a cross section of the enclosed chamber is T-shaped, and each of two opposite sides of the second fluid channel is provided with the first fluid channel.

* * * * *